United States Patent
Matsushita

[11] Patent Number: 6,100,547
[45] Date of Patent: Aug. 8, 2000

[54] FIELD EFFECT TYPE SEMICONDUCTOR DEVICE AND METHOD OF FABRICATING THE SAME

[75] Inventor: Shigeharu Matsushita, Katano, Japan

[73] Assignee: Sanyo Electric Co., Ltd., Osaka-fu, Japan

[21] Appl. No.: 09/113,386

[22] Filed: Jul. 10, 1998

[30] Foreign Application Priority Data

Jul. 14, 1997 [JP] Japan ..................................... 9-188022
Jun. 19, 1998 [JP] Japan .................................. 10-173534

[51] Int. Cl.$^7$ ................................................. H01L 27/085
[52] U.S. Cl. .......................... 257/192; 257/187; 257/189; 257/194; 257/200; 257/206; 257/331; 257/281
[58] Field of Search ..................................... 257/187, 189, 257/192, 194, 200, 206, 331, 281

[56] References Cited

U.S. PATENT DOCUMENTS 5,399,896  3/1995  Oku ......................................... 257/192

OTHER PUBLICATIONS

F. Ren, et al., "Use of Pt Gate Metallization to Reduce Gate Leakage Current in GaAs MESFETs", Journal of Electronic Materials, vol. 20, No. 8, 1991, pp. 595–598.

Takuma Tanimoto, et al., "Single Voltage Supply High Efficiency In GaAs Pseudomorphic Double–Hetero HEMTs with Platinum Buried Gates", Extended Abstracts of the 1995 International Conference on Solid State Devices and Materials, 1995, pp. 947–949.

Kevin J. Chen, et al., "High–Performance InP–Based Enhancement–Mode HEMTs Using Non–Alloyed Ohmic Contacts and Pt–Based Buried–Gate Technologies", IEEE Transactions on Electron Devices, vol. 43, No. 2, pp. 252–257 (1996).

*Primary Examiner*—Fetsum Abraham
*Attorney, Agent, or Firm*—Akin, Gump, Strauss, Hauer & Feld, L.L.P.

[57] ABSTRACT

A first electrode layer composed of Pt is formed on an operating layer, and a second electrode layer composed of a material which is different from Pt is formed on the operating layer so as to cover the first electrode layer. A buried electrode layer composed of Pt is formed in the operating layer under the first electrode layer. The first electrode layer, the second electrode layer and the buried electrode layer constitute a gate electrode.

12 Claims, 11 Drawing Sheets (g)

(h)

(i)

FIELD EFFECT TYPE SEMICONDUCTOR DEVICE AND METHOD OF FABRICATING THE SAME

BACKGROUND OF THE INVENTION

1. Field of the Invention

The present invention relates to a field effect type semiconductor device having a gate electrode and a method of fabricating the same.

2. Description of the Background Art

In an a field effect type semiconductor device such as an MESFET (Metal Semiconductor FET) composed of an III–V group compound semiconductor including GaAs or an HEMT (High Electron Mobility Transistor), a gate electrode which is brought into Schottky contact with an operating layer composed of a semiconductor is used.

FIG. 17 is a schematic cross-sectional view showing one example of a conventional field effect transistor. The field m effect transistor is an MESFET.

In FIG. 17, high-concentration regions 32 and 33 each composed of an $n^+$ layer are formed with predetermined spacing in the surface of a GaAs substrate 31, and an operating layer 34 composed of an n layer is formed between the high-concentration regions 32 and 33. The operating layer 34 functions as a channel. A gate electrode 35 composed of Ti/Pt/Au, f or example, is formed on the operating layer 34, and a source electrode 36 and a drain electrode 37 are respectively formed on the high-concentration regions 32 and 33.

In the field effect transistor shown In FIG. 17, the thickness of a depletion layer 38 formed under the gate electrode 35 can be changed by a gate voltage applied to the gate electrode 35. Consequently, the thickness of the channel is changed, so that a drain current flowing between the source and the drain can be controlled.

In the conventional field effect transistor, such a phenomenon called a gate-lag that a drain current gently rises may occur when the gate voltage applied to the gate electrode 35 rises, thereby decreasing phase noise characteristics and high-power characteristics.

The following points are considered as the cause of the gate-lag. Carriers captured in a trap level 39 on the surface of GaAs enlarge the depletion layer to narrow the channel, so that the drain current decreases in an initial state where the gate voltage rises. Thereafter, the channel extends as the carriers captured in the trap level 39 are gradually discharged from the channel, so that the drain current attains its normal value.

Furthermore, a Fermi level on the surface of GaAs varies by the gate voltage applied to the gate electrode 35. Consequently, the carriers are charged to the trap level 39 on the surface of GaAs, or the carriers captured in the trap level 39 are discharged from the channel. As a result, the drain current varies.

In order to improve characteristics on the surface of GaAs, an attempt to form a high-concentration n layer on the surface of the operation layer 4, cause the surface of the operating layer 4 to have a blocking function of minority carriers, and prevent majority carriers and minority carriers from being recombined on the surface of GaAs has been made.

In order to form the high-concentration n layer on the surface of GaAs, however, the height of a Schottky barrier on the surface of the operating layer with the gate electrode decreases, resulting in degraded gate withstand voltage characteristics.

SUMMARY OF THE INVENTION

An object of the present invention is to provide a field effect type semiconductor device in which device performance based on surface characteristics is prevented from being degraded while maintaining good gate withstand voltage characteristics.

Another object of the present invention is to provide a method of fabricating a field effect transistor in which device performance based on surface characteristics is prevented from being degraded while maintaining good gate withstand voltage characteristics.

A field effect type semiconductor device according to the present invention comprises of a semiconductor layer, and a gate electrode provided on the semiconductor layer, the gate electrode comprising a first electrode layer formed on the semiconductor layer, a second electrode layer formed on the semiconductor layer so as to be adjacent to at least one of side surfaces of the first electrode layer, and a buried electrode layer formed in the semiconductor layer under the first electrode layer.

In the field effect type semiconductor device, the buried electrode layer is formed in the semiconductor layer under the first electrode layer of the gate electrode, and the second electrode layer is formed so as to be adjacent to at least one of the side surfaces of the first electrode layer. In this case, the effective gate length of the gate electrode is determined by the buried electrode layer.

Therefore, the distance between the surface of the semiconductor layer and the channel effectively increases, so that capacitance between the surface of the semiconductor layer and the channel decreases. As a result, it is possible to reduce the effect of charging or discharging of carriers to or from a trap level on the surface of the semiconductor layer on the channel.

A Fermi level on the surface of the semiconductor layer is fixed by the second electrode layer formed on the semiconductor layer. Even if a gate voltage applied to the gate electrode changes, therefore, the Fermi level on the surface of the semiconductor layer does not vary. Consequently, it is possible to prevent carriers from being charged or discharged to or from the trap level due to the variation in the Fermi level on the surface.

These results indicate that a drain current is prevented from unnecessarily varying, so that a gate-lag is prevented from occurring, resulting in improved device performance such as phase noise characteristics and high-power characteristics.

The effective gate length is determined by the buried electrode layer. Even if the length, along the channel, of the second electrode layer of the gate electrode in contact with the semiconductor layer increases, therefore, driving capabilities are prevented from decreasing.

Moreover, a high-concentration impurity layer need not be provided on the surface of the semiconductor layer with the gate electrode, thereby making it possible to maintain good gate withstand voltage characteristics.

The second electrode layer may be formed on the semiconductor layer so as to be adjacent to both the side surfaces of the first electrode layer. Alternatively, the second electrode layer may be formed on the semiconductor layer so as to cover both the side surfaces and the upper surface of the first electrode layer. A reaction preventing layer may be provided between the first electrode layer and the second electrode layer.

It is preferable that the first electrode layer and the buried electrode layer are composed of platinum, palladium or nickel. Consequently, it is possible to easily form the buried electrode layer by burying in the semiconductor layer platinum, palladium or nickel composing the first electrode layer on the semiconductor layer.

The second electrode layer may include a refractory metal. Alternatively, the second electrode layer may be formed of a metal or an alloy which is different from the first electrode layer.

The semiconductor layer may be composed of a III–V group compound semiconductor. In this case, a field effect type semiconductor device capable of operating at high speed is obtained. The semiconductor layer may include GaAs or InP.

The field effect type semiconductor device may further comprise high-concentration impurity regions respectively provided in the semiconductor layer on both sides of the gate electrode, and ohmic electrodes respectively formed on the high-concentration impurity regions. Alternatively, the field effect type semiconductor device may further comprise high-concentration impurity layers respectively provided on the semiconductor layer on both sides of the gate electrode, and ohmic electrodes respectively formed on the high-concentration impurity layers.

The semiconductor layer may be an operating layer. Alternatively, the semiconductor layer is a semiconductor layer provided on an operating layer.

A method of fabricating a field effect type semiconductor device according to another aspect of the present invention comprises the steps of forming a first electrode layer composed of a first conductive material on a semiconductor layer, forming a second electrode layer composed of a second conductive material on the semiconductor layer so as to be adjacent to at least one of side surfaces of the first electrode layer, and forming a buried electrode layer in the semiconductor layer under the first electrode layer by burying in the semiconductor layer the first conductive material composing the first electrode layer by heat treatment.

According to the method of fabricating the field effect type semiconductor device, a field effect type semiconductor device comprising a gate electrode which is constituted by the first electrode layer formed on the semiconductor layer, the second electrode layer formed on the semiconductor layer so as to be adjacent to at least one of the side surfaces of the first electrode layer, and the buried electrode layer formed in the semiconductor layer under the first electrode layer is obtained.

In the field effect type semiconductor device, the effective gate length of the gate electrode is determined by the buried electrode layer. Therefore, the distance between the surface of the semiconductor layer and the channel effectively increases, so that capacitance between the surface of the semiconductor layer and the channel decreases. As a result, it is possible to reduce the effect of charging or discharging of carriers to or from a trap level on the surface of the semiconductor layer on the channel.

A Fermi level on the surface of the semiconductor layer is fixed by the second electrode layer. Even if a gate voltage applied to the gate electrode changes, therefore, the Fermi level on the surface of the semiconductor layer does not vary. Consequently, it is possible to prevent carriers from being charged or discharged to or from the trap level due to the variation in the Fermi level on the surface.

These results indicate that a drain current is prevented from unnecessarily varying, so that a gate-lag is prevented from occurring, resulting in improved device performance such as phase noise characteristics and high-power characteristics.

The effective gate length is determined by the buried electrode layer. Even if the length, along the channel, of the second electrode layer of the gate electrode in contact with the semiconductor layer increases, therefore, driving capabilities are prevented from decreasing.

Moreover, a high-concentration impurity layer need not be provided on the surface of the semiconductor layer with the gate electrode, thereby making it possible to maintain good gate withstand voltage characteristics.

Particularly, the step of forming the first electrode layer may comprise the steps of forming a mask pattern having an opening corresponding to the first electrode layer on the semiconductor layer, and depositing the first conductive material in the opening of the mask pattern, and the step of forming the second electrode layer may comprise the steps of widening the opening of the mask pattern, and depositing the second conductive material in the widened opening of the mask pattern. Consequently, the second electrode layer can be easily formed on the operating layer so as to be adjacent to at least one of the side surfaces of the first electrode layer. The mask pattern may be a photoresist pattern.

The step of forming the first electrode layer may comprise the steps of forming a mask pattern having an opening corresponding to the first electrode layer on the semiconductor layer, and depositing the first conductive material in the opening of the mask pattern, and the step of forming the second electrode layer may comprise the steps of removing the mask pattern, depositing the second conductive material on the semiconductor layer, and patterning the second conductive material, to form the second electrode layer. Consequently, the second electrode layer can be easily formed on the semiconductor layer so as to be adjacent to at least one of the side surfaces of the first electrode layer. The mask pattern may be a photoresist pattern.

The first conductive material may be composed of platinum, palladium or nickel. In this case, the buried electrode layer composed of the first conductive material can be easily formed by burying in the semiconductor layer the first conductive material composing the first electrode layer by heat treatment.

The second conductive material may include a metal or an alloy which is different from the first conductive material. The second conductive material may include a refractory metal.

The method of fabricating the field effect type semiconductor device may further comprise the steps of forming high-concentration impurity regions in the semiconductor layer on both sides of the gate electrode, and respectively forming ohmic electrodes on the high-concentration impurity regions. Alternatively, the method of fabricating the field effect type semiconductor device may further comprise the steps of respectively forming high-concentration impurity layers on the semiconductor layer on both sides of the gate electrode, and respectively forming ohmic electrodes on the high-concentration impurity layers.

A reaction preventing layer may be provided between the first electrode layer and the second electrode layer.

The foregoing and other objects, features, aspects and advantages of the present invention will become more apparent from the following detailed description of the present invention when taken in conjunction with the accompanying drawings.

Figure 1:
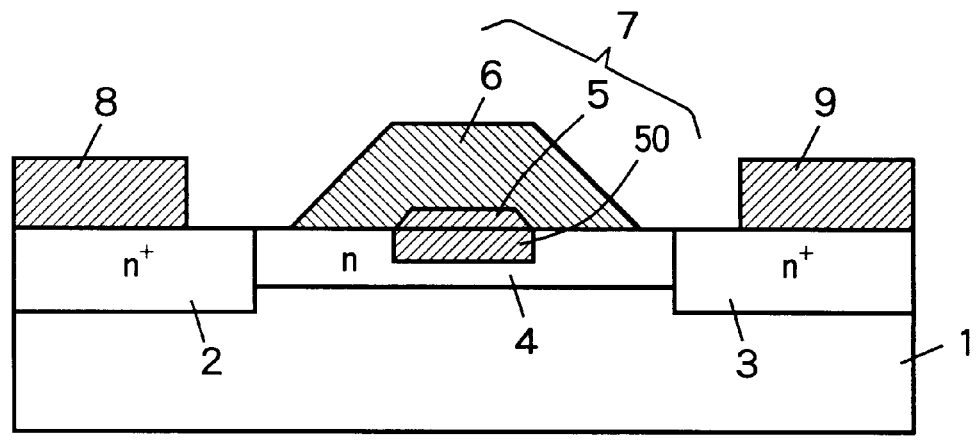
FIG. 1 is a schematic cross-sectional view of a field effect transistor in one embodiment of the present invention.
Figure 5:
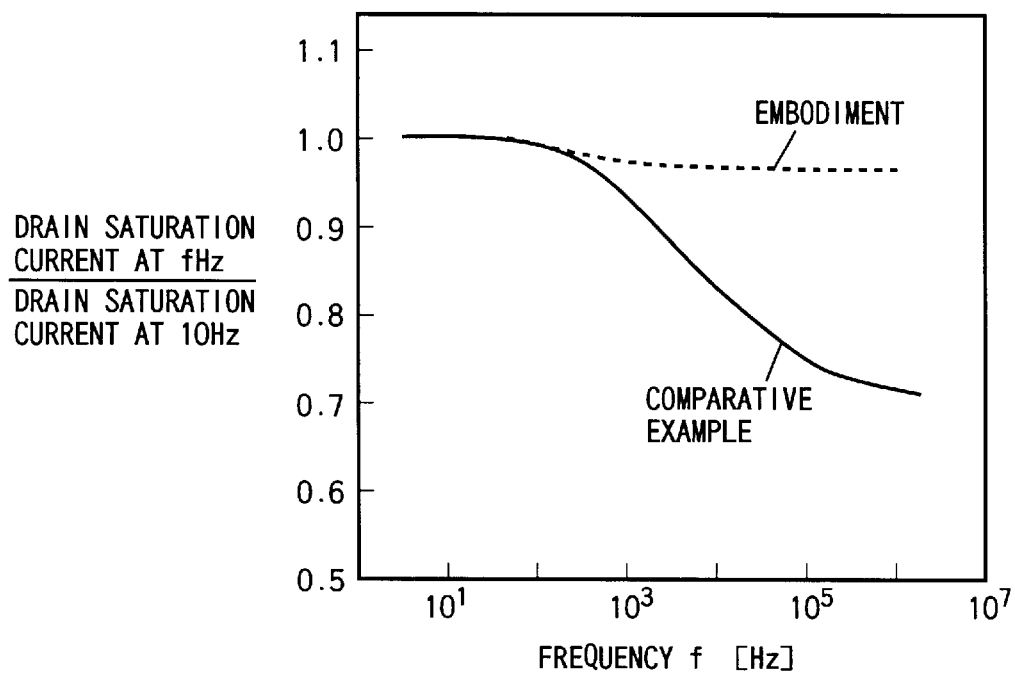
Figure 6:
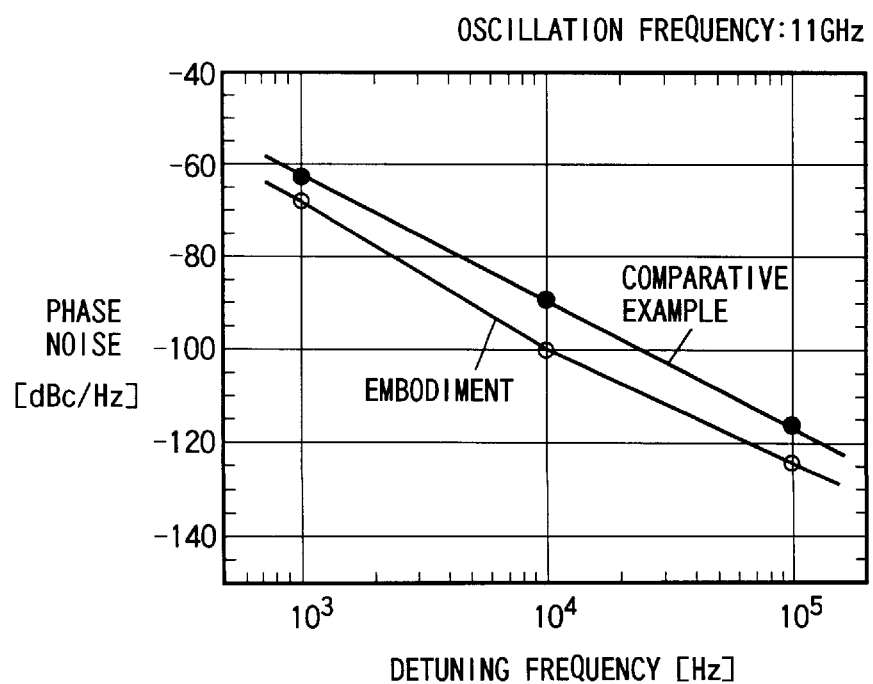
Figure 7:
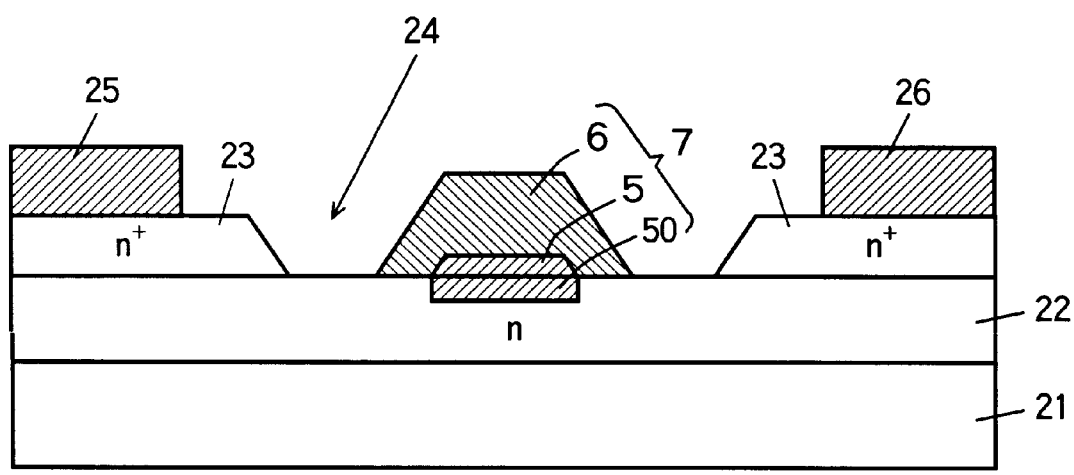
Figure 11:
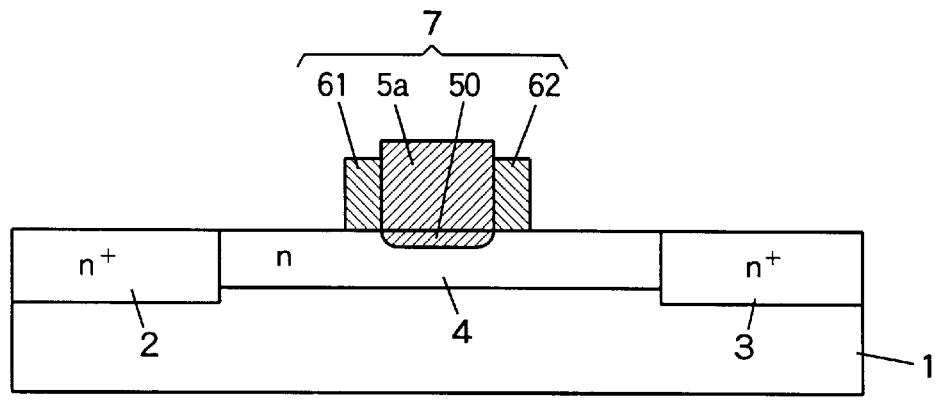
Figure 12:
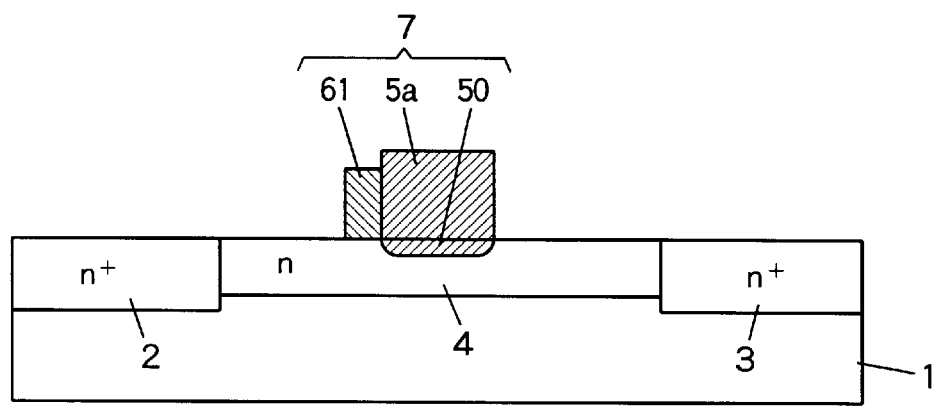
Figure 13:
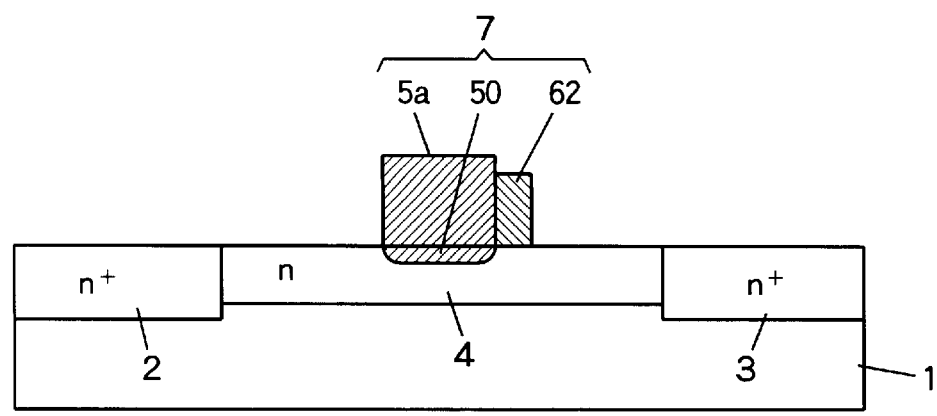
Figure 14:
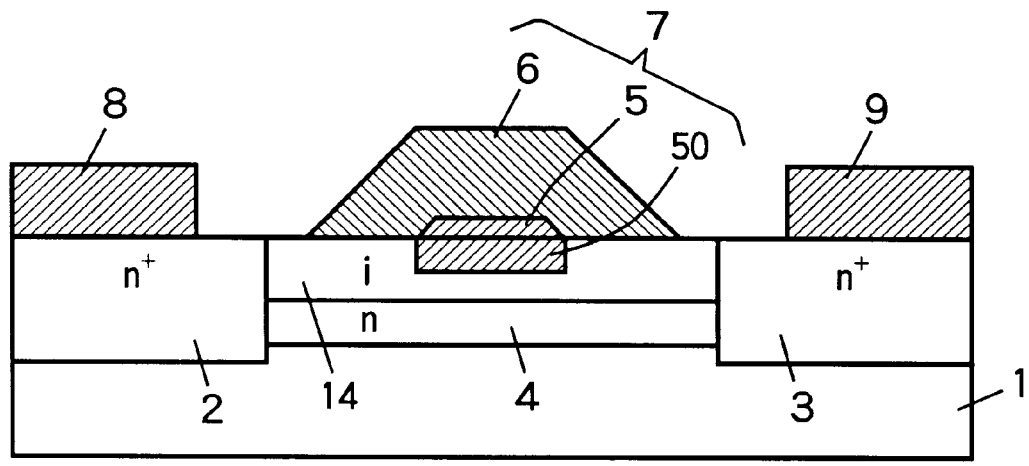
Figure 15:
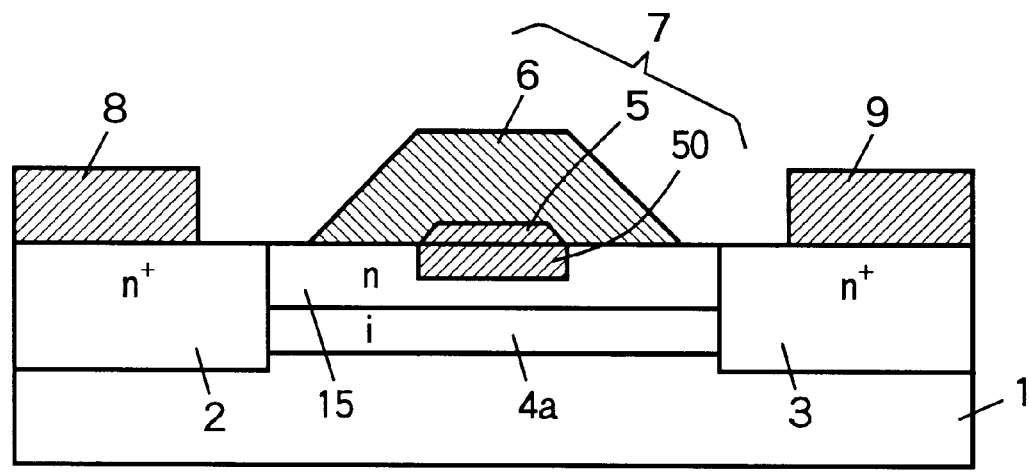
Figure 16:
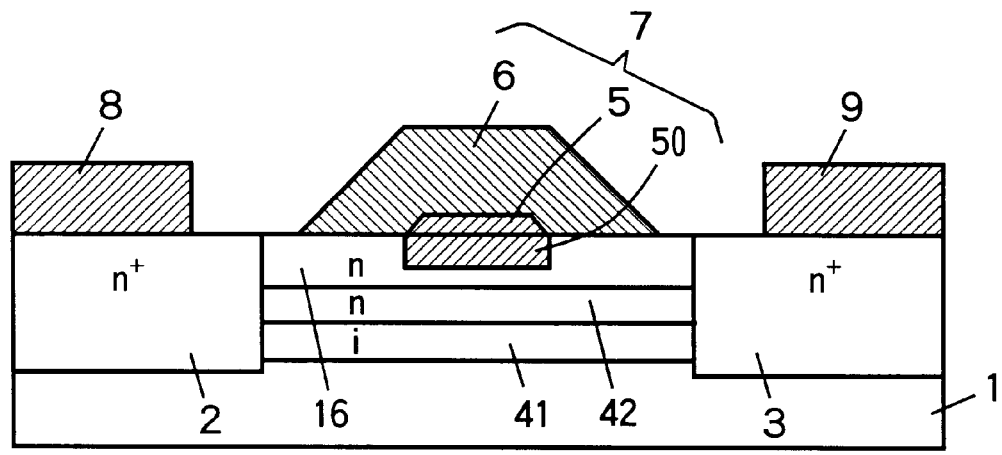
Figure 17:
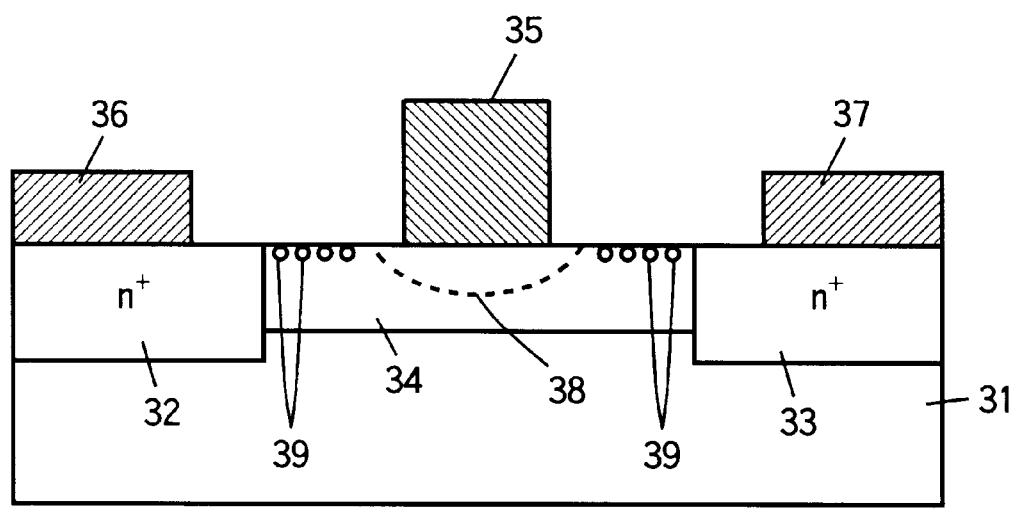

FIGS. (3a–3c) is a schematic cross-sectional view showing the steps of a method of fabricating the field effect transistor shown in FIG. 1;

FIGS. (4d–4f) is a schematic cross-sectional view showing the steps of a method of fabricating the field effect transistor shown in FIG. 1;

FIG. 5 is a diagram showing the results of measurements of the frequency dispersion of a drain saturation current in field effect transistors in the embodiment and a comparative example;

FIG. 6 is a diagram showing the results of measurements of phase noise characteristics in the field effect transistors in the embodiment and the comparative example;

FIG. 7 is a schematic cross-sectional view of a field effect transistor in another embodiment of the present invention;

FIGS. (8a–8c) is a schematic cross-sectional view showing the steps of a method of fabricating a field effect transistor in still another embodiment of the present invention;

FIGS. (9d–9f) is a schematic cross-sectional view showing the steps of a method of fabricating a field effect transistor in a further embodiment of the present invention:

FIGS. (10g–10i) is a schematic sectional view showing the steps of a method of fabricating a field effect transistor in a still further embodiment of the present invention;

FIG. 11 is a schematic cross-sectional view showing another example of a gate electrode;

FIG. 12 is a schematic cross-sectional view showing still another example of a gate electrode;

FIG. 13 is a schematic cross-sectional view showing a further example of a gate electrode;

FIG. 14 is a schematic cross-sectional view of a field effect transistor in a still further embodiment of the present invention;

FIG. 15 is a schematic cross-sectional view of a HEMT in a still further embodiment of the present;

FIG. 16 is a schematic cross-sectional view of a TMT in a still further embodiment of the present; and FIG. 17 is a schematic cross-sectional view showing one example of a conventional field effect transistor.

DESCRIPTION OF THE PREFERRED EMBODIMENTS

FIG. 1 is a schematic cross-sectional view of a field effect transistor in one embodiment of the present invention. The field effect transistor is an MESFET composed of GaAs.

In FIG. 1, high-concentration regions 2 and 3 each composed of an n+ layer are formed with predetermined spacing in the surface of a GaAs substrate 1, and an operating layer 4 composed of an n layer is formed between the high-concentration regions 2 and 3. A source electrode 8 and a drain electrode 9 are respectively formed on the high-concentration regions 2 and 3.

A first electrode layer 5 composed of Pt (platinum) is formed on the operating layer 4, and a second electrode layer 6 composed of Ti/Pt/Au, for example, Is formed on the operating layer 4 so as to cover the first electrode layer 5. A buried electrode layer 50 composed of Pt is formed in the operating layer 4 under the first electrode layer 5. The first electrode layer 5, the second electrode layer 6 and the buried electrode layer 50 constitute a gate electrode 7.

Figure 2:
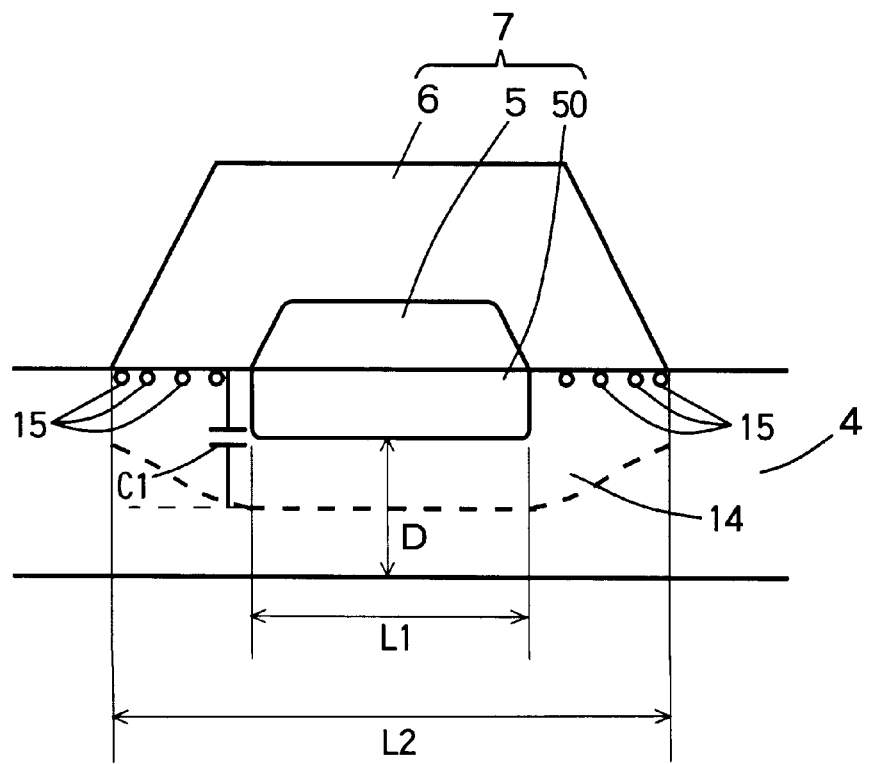
FIG. 2 is an enlarged sectional view for explaining operations performed by the field effect transistor shown in FIG. 1.

FIG. 2 is an enlarged sectional view of a principal part of the field effect transistor shown in FIG. 1. Referring to FIG. 2, operations performed by the field effect transistor shown in FIG. 1 will be described.

In FIG. 2, the length L1, along the channel, of the buried electrode layer 50 is 0.5 $\mu$m, for example, and the length L2, along the channel, of the second electrode layer 6 is 1 $\mu$m, for example. In this case, the effective gate length of the gate electrode 7 is equal to the length L1, along the channel, of the buried electrode layer 50. When a gate voltage is applied to the gate electrode 7, a depletion layer 14 is formed around the buried electrode layer 50 and under the second electrode layer 6.

Suppose the distance D between the lower surface of the buried electrode layer 50 and the lower surface of the operating layer 4 is equal to the distance between the lower surface of the gate electrode and the lower surface of the operating layer in the conventional field effect transistor. In this case, the distance between the surface of the operating layer 4 and the channel effectively increases. Consequently, capacitance C1 between the surface of the operating layer 4 and the channel decreases. As a result, it is possible to reduce the effect of charging or discharging of carriers to or from a trap level 15 on the surface of GaAs on the channel.

A Fermi level on the surface of GaAs is fixed by the second electrode layer 6. Even if the gate voltage applied to the gate electrode 7 changes, the Fermi level on the surface of GaAs does not vary. Carriers are prevented from being charged or discharged to or from the trap level 15 due to the variation in the Fermi level on the surface of GaAs.

These results indicate that a drain current is prevented from unnecessarily varying, so that a gate-lag is prevented from occurring, resulting in improved performance of the field effect transistor such as phase noise characteristics and high-power characteristics.

In general, as the gate length of the gate electrode increases, driving capabilities such as transconductance decrease. In the field effect transistor according to the present embodiment, however, the effective gate length is determined by the length L1, along the channel, of the buried electrode layer 50. Even if the length L2, along the channel, of the second electrode layer 6 of the gate electrode 7 in contact with the operating layer 4 increases, therefore, the driving capabilities of the field effect transistor are prevented from decreasing.

Moreover, a high-concentration n layer need not be formed on the surface of the operating layer 4, thereby making it possible to maintain good gate withstand voltage characteristics.

In the field effect transistor according to the present embodiment, a gate-lag can be prevented from occurring by reducing an influence of surface characteristics on a channel while maintaining good gate withstand voltage characteristics, resulting in improved device performance such as phase noise characteristics and high-power characteristics.

Figure 3:
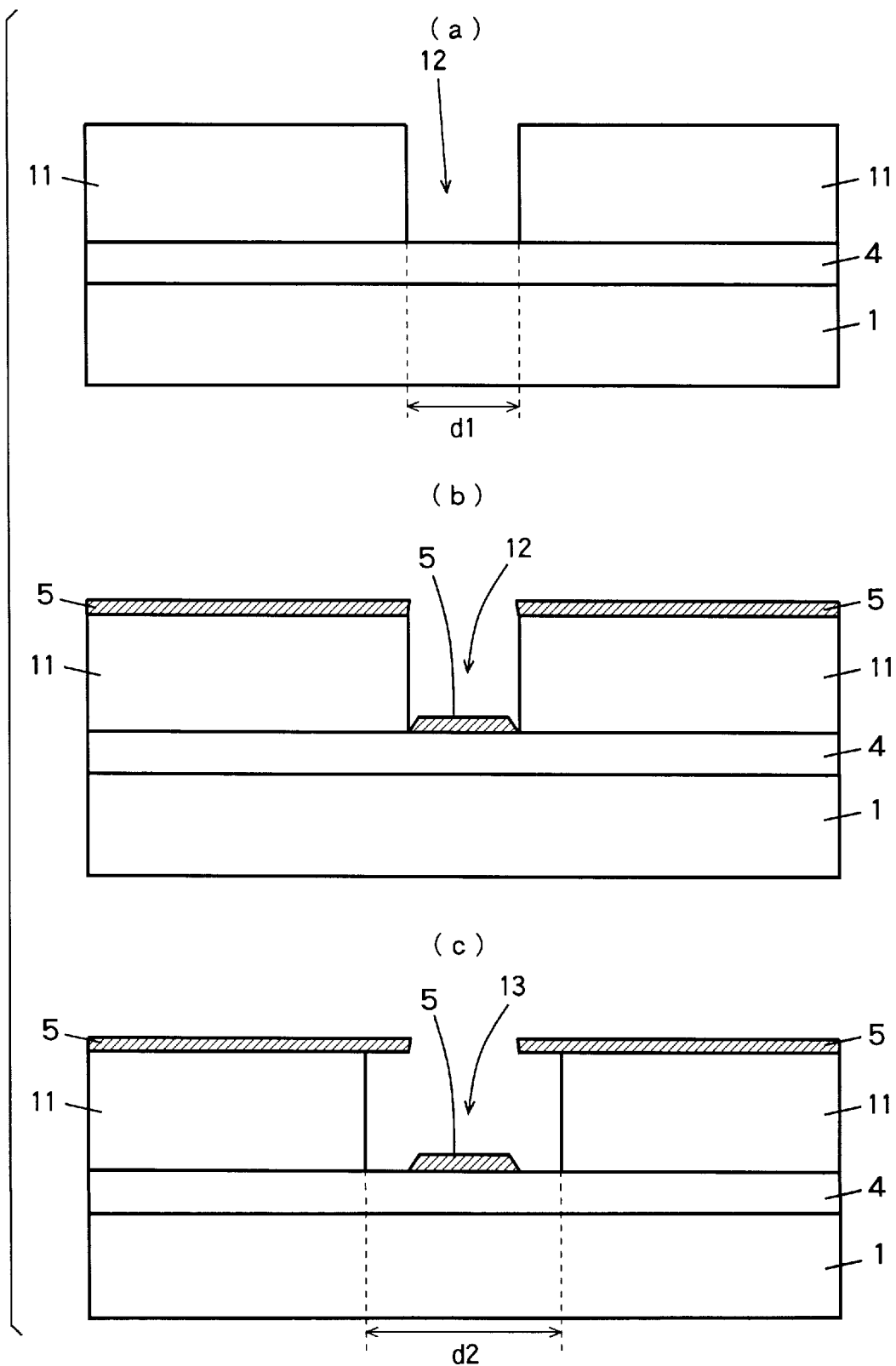
Figure 4:
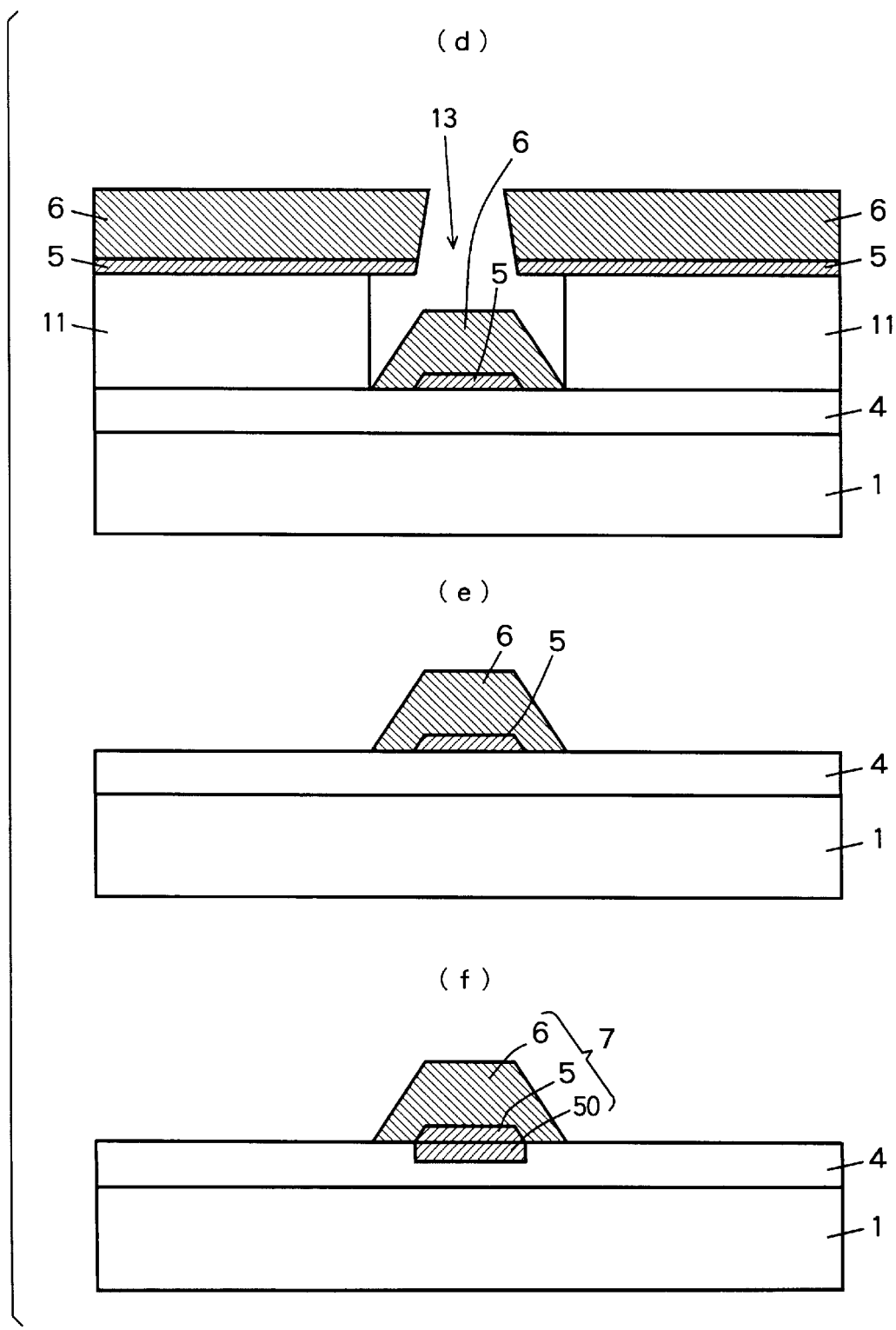

FIGS. 3 and 4 are schematic cross-sectional views showing the steps of one example of a method of fabricating the field effect transistor shown in FIG. 1.

As shown in FIG. 3(a), a gate pattern composed of a photoresist 11 is formed on the operating layer 4 on the GaAs substrate 1. The photoresist 11 has an opening 12 corresponding to a gate portion. The width d1 of the opening 12 is 0.5 $\mu$m, for example. The length, along the channel, of a first electrode layer 5 formed in the subsequent step is defined by the width d1.

As shown in FIG. 3(b), a first electrode layer 5, composed of Pt, having a thickness of 250 Å is then formed on the whole surface of the photoresist 11 on the operating layer 4 by an evaporation method.

As shown in FIG. 3(c), the opening 12 of the photoresist 11 is then widened by etching using oxygen plasma, to form an opening 13. The width d2 of the opening 13 is 1 μm, for example. The length, along the channel, of a second electrode layer 6 formed in the subsequent step is defined by the width d2.

Thereafter, Ti having a thickness of 250 Å, Pt having a thickness of 500 Å, and Au having a thickness of 5000 Å are successively evaporated, to form a second electrode layer 6 composed of Ti/Pt/Au, as shown in FIG. 4(d).

Furthermore, the photoresist 11, together with the first electrode layer 5 and the second electrode layer 6 above the photoresist 11, is removed using a lift-off method, as shown in FIG. 4(e).

As shown in FIG. 4(f), Pt composing the first electrode layer 5 is buried in the operating layer 4 by performing heat treatment at a temperature of approximately 300° C., thereby forming a buried electrode layer 50, composed of Pt, having a thickness of 500 Å.

The high-concentration regions 2 and 3, the source electrode 8 and the drain electrode 9 shown in FIG. 1 may be formed before forming the gate electrode 7 or after forming the gate electrode 7.

The characteristics of the field effect transistor in the embodiment and a field effect transistor in a comparative example are measured. The field effect transistor in the embodiment has the gate electrode 7 shown in FIG. 1, while the field effect transistor in the comparative example has a gate electrode composed of Ti/Pt/Au in place of the gate electrode 7 shown in FIG. 1.

FIG. 5 is a diagram showing the results of measurements of the frequency dispersion of a drain saturation current in the field effect transistors in the embodiment and the comparative example. In FIG. 5, the horizontal axis represents a frequency f [Hz], and the vertical axis represents a drain saturation current at a frequency of fHz which is standardized by a drain saturation current at a frequency of 10 Hz.

Input pulses are respectively fed to the gate electrode 7 in the field effect transistor in the embodiment and the gate electrode in the field effect transistor in the comparative example, to measure the drain saturation currents. It can be considered that an input pulse having m a frequency of 10 Hz is nearly in a DC state.

As shown in FIG. 5, in the field effect transistor in the comparative example having the gate electrode composed of Ti/Pt/Au, the drain saturation current decreases as the frequency of the input pulse increases, and the drain saturation current at a frequency of 1 MHz decreases by approximately 30% from the drain saturation current at a frequency of 10 Hz.

On the other hand, in the field effect transistor in the embodiment having the gate electrode 7, the drain saturation current hardly decreases even if the frequency of the input pulse increases, and the drain saturation current at a frequency of 1 MHz only decreases by approximately 3% from the drain saturation current at a frequency of 10 Hz.

In the field effect transistor in the embodiment, the drain saturation current is prevented from decreasing as the frequency increases. A gate withstand voltage at this time is approximately 10 V, which is good, in the embodiment and the comparative example.

Table 1 shows the results of measurements of high-power characteristics in the field effect transistors in the embodiment and the comparative example. Both the gate widths of the field effect transistors in the embodiment and the comparative example are taken as 12 mm.

TABLE 1

|  | Embodiment | Comparative Example |
| --- | --- | --- |
| Output Power Pout[dBm] | 31.8 | 30.2 |
| Gate withstand Voltage[V] | 10.1 | 11.0 |

In Table 1, output power Pout indicates output power in a case where adjacent channel leakage at a detuning frequency of 50 KHz is −51 dBc. As shown in Table 1, in the field effect transistor in the embodiment, the output power Pout is 31.8 dBm, which is improved by 1.6 dBm, as compared with 30.2 dBm in the field effect transistor in the comparative example. A gate withstand voltage at this time is approximately 10 V, which is good, in the field effect transistors in the embodiment and the comparative example.

FIG. 6 is a diagram showing the results of measurements of phase noise characteristics in the field effect transistors in the embodiment and the comparative example. In FIG. 6, the horizontal axis represents a detuning frequency, and the vertical axis represents phase noise.

The phase noise characteristics are evaluated by respectively carrying the field effect transistors in the embodiment and the comparative example in oscillator circuits using dielectric resonators. The oscillation frequency is taken as 11 GHz.

As shown in FIG. 6, the phase noise at a detuning frequency of 10 KHz is −90 dBc/Hz in the field effect transistor in the comparative example having the gate electrode composed of Ti/Pt/Au, while being −100 dBc/Hz in the field effect transistor in the embodiment having the gate electrode 7. This indicates that in the field effect transistor in the embodiment, the phase noise characteristics are improved, as compared with the field effect transistor in the comparative example. A gate withstand voltage at this time is approximately 8 V, which is good, in the field effect transistors in the embodiment and the comparative example.

In the field effect transistor in the embodiment, the phase noise characteristics and the high-power characteristics are improved while maintaining good gate withstand voltage characteristics.

FIG. 7 is a schematic cross-sectional view of a field effect transistor in another embodiment of the present invention. The field effect transistor shown in FIG. 7 is an MESFET having a recess structure.

In FIG. 7, an operating layer 22 composed of an n layer is formed on a GaAs substrate 21. $n^+$ layers 23 are formed on the operating layer 22, and a recess (a concave portion) 24 is formed at the center of the area between the $n^+$ layers; 23. A source electrode 25 and a drain electrode 26 are respectively formed on the $n^+$ layers 23. A gate electrode 7 having the structure shown in FIG. 1 is formed in the operating layer 22 in the recess 24.

Also in the field effect transistor in the present embodiment, a gate-lag can be prevented from occurring bad reducing an influence of surface characteristics on a channel while maintaining good gate withstand voltage characteristics, resulting in improved phase noise characteristics and high-power characteristics.

Figure 8:
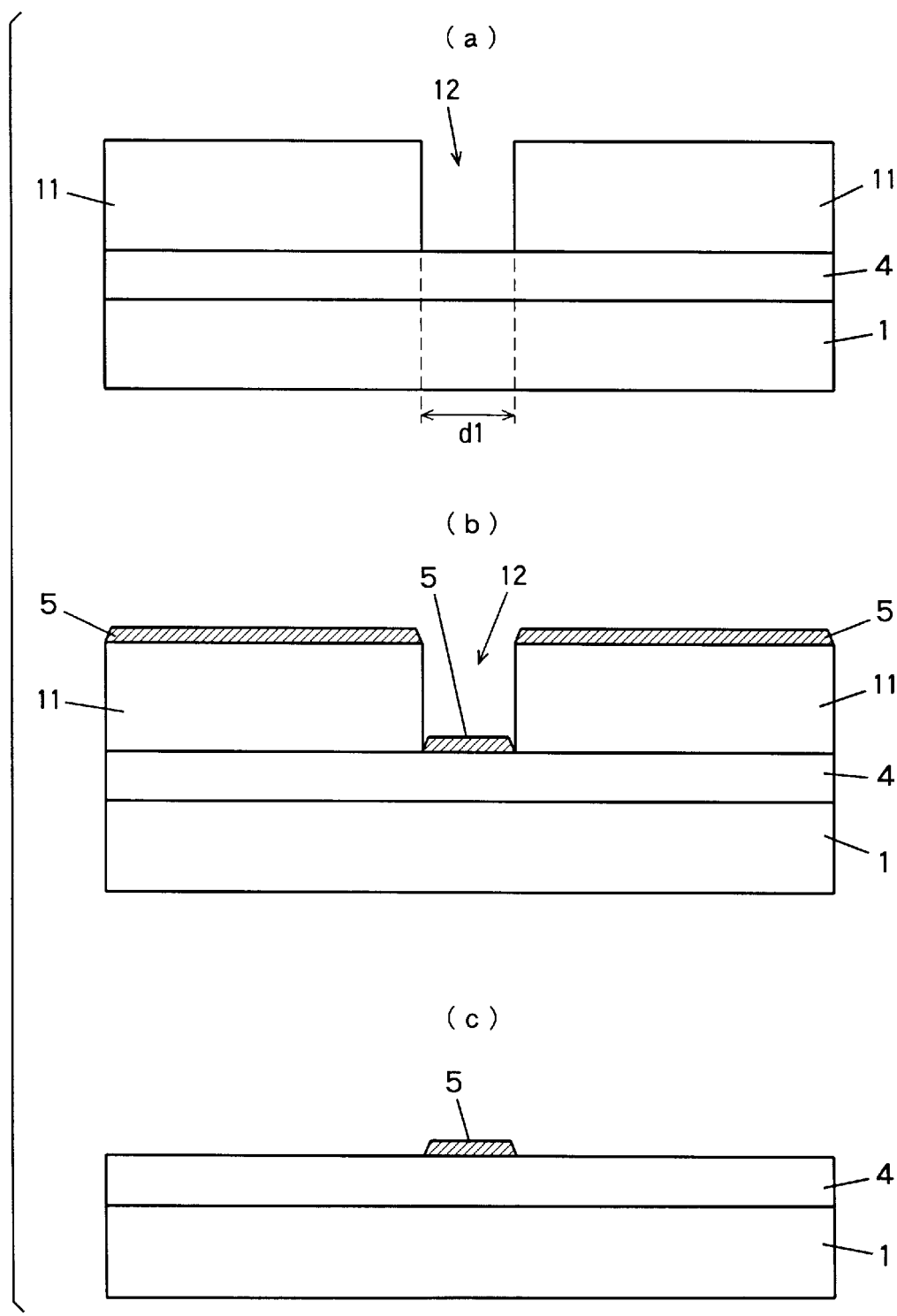
Figure 9:
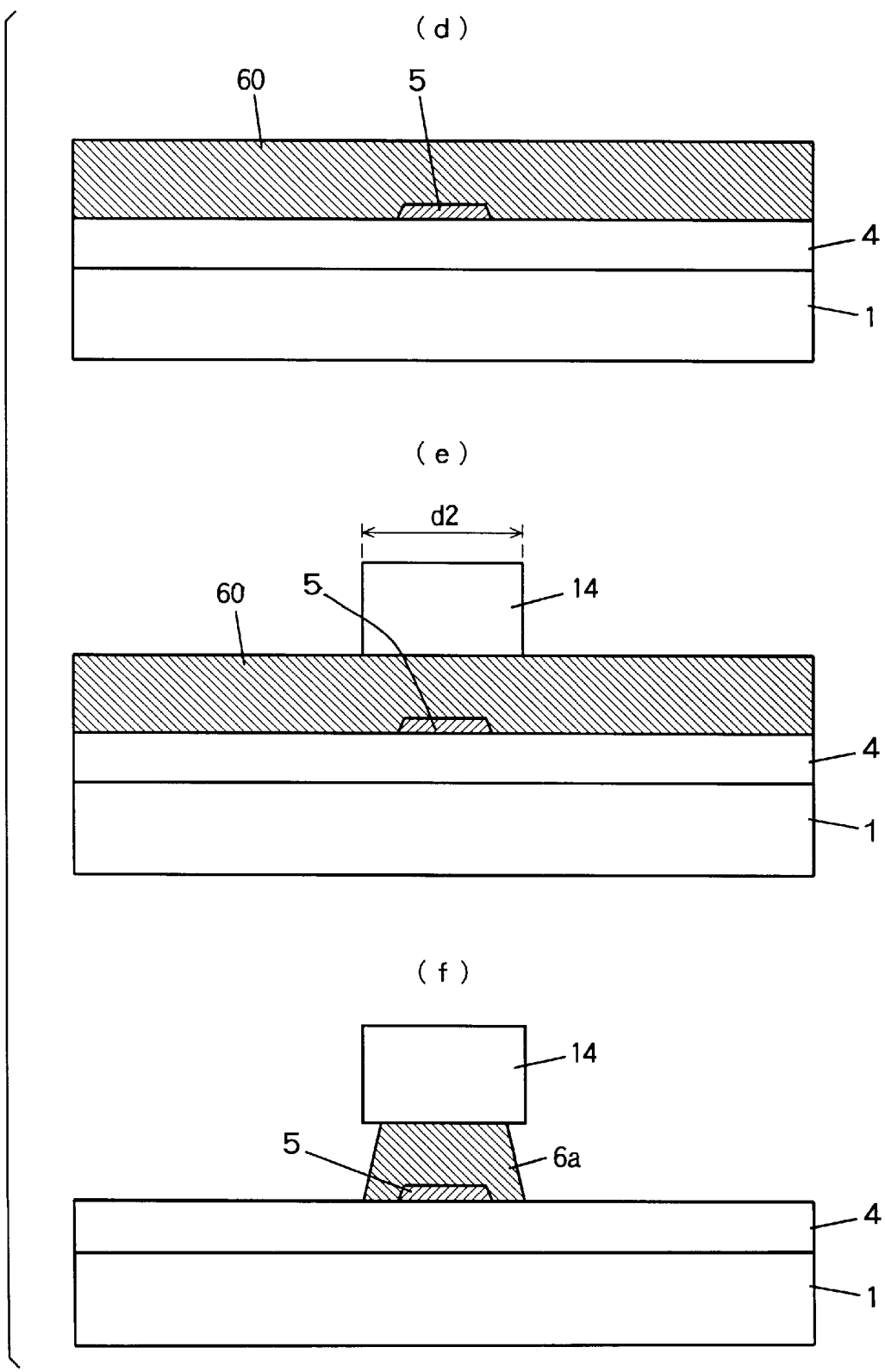
Figure 10:
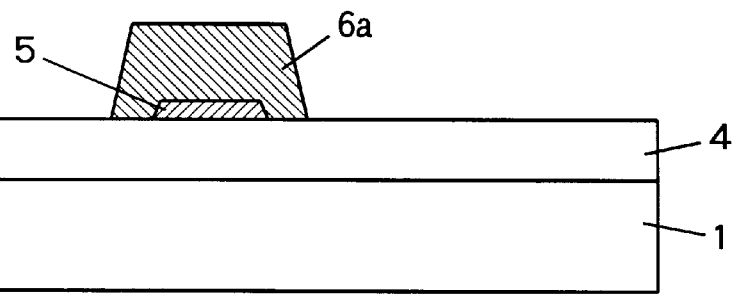
Figure 10:
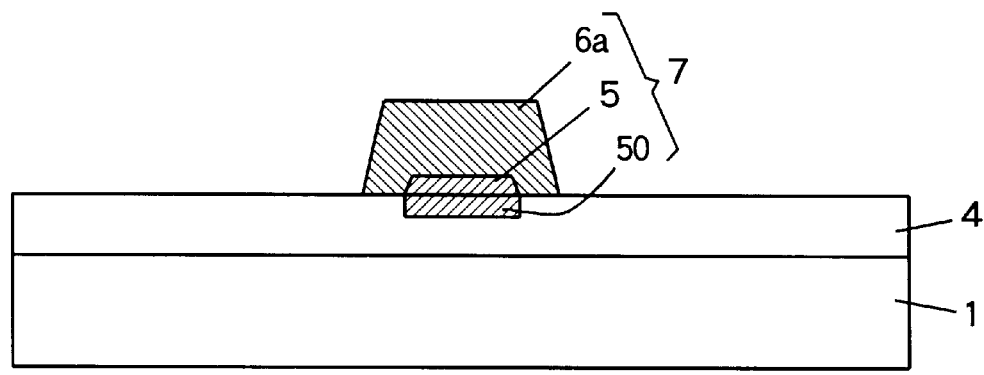
Figure 10:
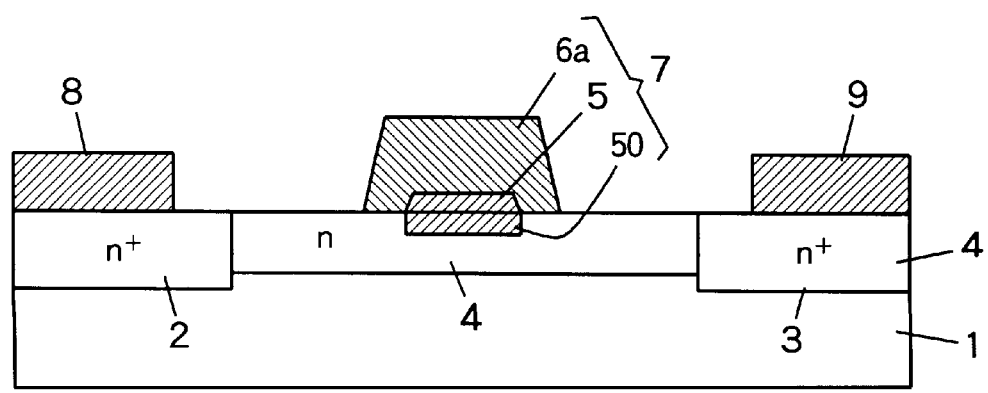

FIGS. 8, 9 and 10 are schematic cross-sectional views showing the steps of one example of a method of fabricating a field effect transistor in still another embodiment of the present invention.

As shown in FIG. 8(a), a gate pattern composed of a photoresist 11 is first formed on an operating layer 4 on a GaAs substrate 1. The photoresist 11 has an opening 12 corresponding to a gate portion. The width d1 of the opening 12 is 0.5 μm, for example. The length, along the channel, of a first electrode layer 5 formed in the subsequent step, is defined by the width d1.

As shown in FIG. 8(b), a first electrode layer 5, composed of Pt, having a thickness of 250 Å is then formed on the whole surface of the photoresist 11 on the operating layer 4 by an evaporation method.

As shown in FIG. 8(c), the photoresist 11, together with the first electrode layer 5 above the photoresist 11, is then removed using a lift-off method.

Thereafter, a WSi layer 60 having a thickness of 6000 Å is formed on the operating layer 4 and the first electrode layer 5 by a sputtering method, as shown in FIG. 9(d).

As shown in FIG. 9(e), a photoresist is then formed on the WSi layer 60, and the photoresist is patterned, to form a photoresist pattern 14 on the WSi layer 60 above the first electrode layer 5. The width d2 of the photoresist pattern 14 is 1 μm, for example. The length, along the channel, of a second electrode layer 6a formed in the subsequent step is defined by the width d2.

Thereafter, the WSi layer 60 is etched by reactive ion etching (RIE) using reactive gas including $CF_4$ and $O_2$, to form a second electrode layer 6a, as shown in FIG. 9(f).

As shown in FIG. 10(g), the photoresist pattern 14 on the second electrode layer 6a is then removed. Thereafter, as shown in FIG. 10(h), Pt composing the first electrode layer 5 is buried in the operating layer 4 by performing heat treatment at a temperature of approximately 300° C., thereby forming a buried electrode layer 50, composed of Pt, having a thickness of 500 Å. A gate electrode 7 comprising the first electrode layer 5, the second electrode layer 6a and the buried electrode layer 50 is thus formed.

Thereafter, as shown in FIG. 10(i), high-concentration regions 2 and 3 each composed of an $n^+$ layer are respectively formed with predetermined spacing on both sides of the buried electrode layer 50, to respectively form a source electrode 8 and a drain electrode 9. The high-concentration regions 2 and 3, the source electrode 8 and the drain electrode 9 may be formed before forming the gate electrode 7.

Also in the field effect transistor in the present embodiment, a gate-lag can be prevented from occurring by reducing an influence of surface characteristics on a channel while maintaining good gate withstand voltage characteristics, resulting in improved device performance such as phase noise characteristics and high-power characteristics.

FIGS. 11, 12 and 13 are schematic cross-sectional views respectively showing other examples of the gate electrode 7.

In the example of FIG. 11, a first electrode layer 5a composed of Pt is formed on an operating layer 4. A buried electrode layer 50 composed of Pt is formed in the operating layer 4 under the first electrode layer 5a. Second electrode layers 61 and 62 composed of Ti/Pt/Au are respectively formed on the operating layer 4 so as to be brought into contact with both side surfaces of the first electrode layer 5a. The thickness of the second electrode layers 61 and 62 is smaller than the thickness of the first electrode layer 5a. Alternatively, the thickness of the second electrode layers 61 and 62 may be equal to the thickness of the first electrode layer 5a.

In the example of FIG. 12, a second electrode layer 61 composed of Ti/Pt/Au is formed so as to be brought into contact with one side surface of a first electrode layer 5a on the side of a source electrode 8. In the example of FIG. 13, a second electrode layer 62 composed of Ti/Pt/Au is formed so as to be brought into contact with one side surface of a first electrode layer 5a on the side of a drain electrode 9.

Also in field effect transistors respectively having the gate electrodes 7 shown in FIGS. 11, 12 and 13, a gate-lag can be prevented from occurring by reducing an influence of surface characteristics on a channel while maintaining good gate withstand voltage characteristics on a channel, resulting in improved device performance such as phase noise characteristics and high output characteristics.

The material of the second electrode layers 6, 6a, 61 and 62 is not limited to Ti/Pt/Au or WSi. In addition thereto, various metals or alloys or a laminated film of metals or alloys can be used. Examples include refractory metals or refractory alloys such as W, WN, WSiN. Further, a laminated film of W, WN, WSi or WSiN and Au can be also used.

Alternatively, Ti/Al can be also used.

As the material of the first electrode layers 5 and 5a, Pd (palladium) or Ni(nickel) may be used in place of Pt.

Furthermore, a substrate composed of another compound semiconductor, for example, an InP substrate or other substrates respectively composed of various semiconductor materials can be used in place of the GaAs substrate.

Additionally, reactive preventing layers composed of Mo, W, WN, WSi, WSiN or the like may be respectively provided between the first electrode layers 5 and 5a and the second electrode layers 6, 6a, 61 and 62.

The present invention is not limited to an MESFET composed of GaAs, and is applicable to various field effect type semiconductor devices respectively having gate electrodes. For example, the present invention may be applied to an HEMT (High Electron Mobility Transistor) composed of GaAs and a TMT (Two-Mode Channel FET) reported in IEEE ELECTRON DEVICE LETTERS, VOL. 14, NO. 7, JULY 1993, pp.354–356.

FIG. 14 is a schematic cross-sectional view of a field effect transistor in a still further embodiment of the present invention. The field effect transistor is an MESFET composed of GaAs.

In FIG. 14, high-concentration regions 2 and 3 each composed of an $n^+$ layer are formed with predetermined spacing in the surface of a GaAs substrate 1, and an operating layer 4 composed of an n layer and a semiconductor layer 14 undoped or doped at a low concentration are formed in this order between the high-concentration regions 2 and 3. The operating layer 4 and the semiconductor layer 14 are composed of GaAs.

A first electrode layer 5 is formed on the semiconductor layer 14, and a second electrode layer 6 is formed on the semiconductor layer 14 so as to cover the first electrode layer 5. A buried electrode layer 50 is formed in the semiconductor layer 14 under the first electrode layer 5. The structure of other portions of the field effect transistor in FIG. 14 is similar to the structure of the field effect transistor in FIG. 1.

Also in the field effect transistor in the present embodiment, a gate-lag can be prevented from occurring by reducing an influence of surface characteristics on a channel awhile maintaining good gate withstand voltage characteristics, resulting in improved device performance such as phase noise characteristics and high-power characteristics.

FIG. 15 is a schematic cross-sectional view of a HEMT in a still further embodiment of the present invention.

In FIG. 15, high-concentration regions 2 and 3 each composed of an $n^+$ layer are formed with predetermined spacing in the surface of a GaAs substrate 1, and an operating layer 4a undoped or doped at a low concentration and an electron supplying layer 15 composed of an n layer are formed in this order between the high-concentration regions 2 and 3. The operating layer 4a is composed of GaAs and the electron supplying layer 15 is composed of AlGaAs.

A first electrode layer 5 is formed on the electron supplying layer 15, and a second electrode layer 6 is formed on the electron supplying layer 15 so as to cover the first electrode layer 5. A buried electrode layer 50 is formed in the electron supplying layer 15 under the first electrode layer 5. The structure of other portions of the HEMT in FIG. 15 is similar to the structure of the field effect transistor in FIG. 1.

Also in the HEMT in the present embodiment, a gate-lag can be prevented from occurring by reducing an influence of surface characteristics on a channel while maintaining good gate withstand voltage characteristics, resulting in improved device performance such as phase noise characteristics and high-power characteristics.

FIG. 16 is a schematic cross-sectional view of a TMT in a still further embodiment of the present invention.

In FIG. 16, high-concentration regions 2 and 3 each composed of an $n^+$ layer are formed with predetermined spacing in the surface of a GaAs substrate 1, and a first operating layer 41 undoped or doped at a low concentration, a second operating layer 42 composed of an n layer and an electron supplying layer 16 composed of an n layer are formed between the high-concentration regions 2 and 3. The first operating layer 41 and the second operating layer 42 are composed of GaAs and the electron supplying layer 16 is composed of AlGaAs.

A first electrode layer 5 is formed on the electron supplying layer 16, and a second electrode layer 6 is formed on the electron supplying layer 16 so as to cover the first electrode layer 5. A buried electrode layer 50 is formed in the electron supplying layer 16 under the first electrode layer 5. The structure of other portions of the TMT in FIG. 16 is similar to the structure of the field effect transistor in FIG. 1.

Also in the TMT in the present embodiment, a gate-lag can be prevented from occurring by reducing an influence of 10 surface characteristics on a channel while maintaining good gate withstand voltage characteristics, resulting in improved device performance such as phase noise characteristics and high-power characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field effect type semiconductor device comprising:
   a semiconductor layer; and
   a gate electrode provided on said semiconductor layer, said gate electrode comprising
      a first electrode layer formed on said semiconductor layer,
      a second electrode layer formed on said semiconductor layer so as to be adjacent to at least one of side surfaces of said first electrode layer, and
      a buried electrode layer formed in said semiconductor layer under said first electrode layer, said first electrode layer being in contact with said buried electrode layer and said second electrode layer being in contact with said semiconductor layer.

2. The field effect type semiconductor device according to claim 1, wherein
   said second electrode layer is formed on said semiconductor layer so as to be adjacent to both the side surfaces of said first electrode layer.

3. The field effect type semiconductor device according to claim 1, wherein
   said second electrode layer is formed on said semiconductor layer so as to cover both the side surfaces and the upper surface of said first electrode layer.

4. The field effect type semiconductor device according to claim 1, wherein
   said first electrode layer and said buried electrode layer are composed of platinum, palladium or nickel.

5. The field effect type semiconductor device according to claim 1, wherein
   said second electrode layer includes a refractory metal.

6. The field effect type semiconductor device according to claim 1, wherein
   said second electrode layer is formed of a metal or an alloy which is different from said first electrode layer.

7. The field effect type semiconductor device according to claim 1, wherein said semiconductor layer is composed of a III–V group compound semiconductor.

8. The field effect type semiconductor device according to claim 7, wherein
   said semiconductor layer includes GaAs or InP.

9. The field effect type semiconductor device according to claim 1, further comprising
   high-concentration impurity regions respectively provided in the semiconductor layer on both sides of said gate electrode, and
   ohmic electrodes respectively formed on said high-concentration impurity regions.

10. The field effect type semiconductor device according to claim 1, further comprising
    high-concentration impurity layers respectively provided on said semiconductor layer on both sides of said gate electrode, and
    ohmic electrodes respectively formed on said high-concentration impurity layers.

11. The field effect type semiconductor device according to claim 1, wherein
    said semiconductor layer is an operating layer.

12. The field effect type semiconductor device according to claim 1, wherein
    said semiconductor layer is a semiconductor layer provided on an operating layer.

* * * * *